United States Patent [19]
Miyashita

[11] Patent Number: 5,863,405
[45] Date of Patent: *Jan. 26, 1999

[54] PROCESS FOR FORMING CONDUCTIVE CIRCUIT ON THE SURFACE OF MOLDED ARTICLE

[75] Inventor: Takayuki Miyashita, Shizuoka, Japan

[73] Assignee: Polyplastics Co., Ltd., Japan

[*] Notice: The term of this patent shall not extend beyond the expiration date of Pat. No. 5,525,205.

[21] Appl. No.: 284,546
[22] PCT Filed: May 18, 1994
[86] PCT No.: PCT/JP94/00799
  § 371 Date: Aug. 8, 1994
  § 102(e) Date: Aug. 8, 1994
[87] PCT Pub. No.: WO95/31884
  PCT Pub. Date: Nov. 23, 1995
[51] Int. Cl.[6] ............... C25D 5/02
[52] U.S. Cl. ............ 205/125; 205/126; 205/136; 29/852
[58] Field of Search ............ 29/852; 205/125, 205/126, 136

[56] References Cited

U.S. PATENT DOCUMENTS

| | | |
|---|---|---|
| 4,200,975 | 5/1980 | Debiec et al. ............ 29/842 |
| 4,870,751 | 10/1989 | Antoon . | |
| 4,898,648 | 2/1990 | Cusano . | |
| 5,109,149 | 4/1992 | Leung ............ 219/121.8 |
| 5,137,618 | 8/1992 | Burnett et al. ............ 427/98 |
| 5,168,624 | 12/1992 | Shirai ............ 29/852 |
| 5,390,412 | 2/1995 | Gregoire ............ 29/852 |

FOREIGN PATENT DOCUMENTS

| | | |
|---|---|---|
| 0 287 843 | 10/1988 | European Pat. Off. . |
| 0 543 045 A1 | 11/1991 | European Pat. Off. . |
| 60-8592 | 1/1985 | Japan . |
| 61-262287 | 11/1986 | Japan . |
| 63-169791 | 7/1988 | Japan . |
| 63-283185 | 11/1988 | Japan . |
| 4-263490 | 9/1992 | Japan . |

*Primary Examiner*—P. W. Echols
*Attorney, Agent, or Firm*—Nixon & Vanderhye P.C.

[57] ABSTRACT

Conductive circuits are formed by first metallizing a surface of a molded synthetic resin substrate to form an electrically conductive metallic film coating thereon of a thickness (e.g., between 0.2 to 2 $\mu$m) effective to exhibit sufficient electrical conductivity for subsequent electroplating thereon. Non-circuit portions of the metallic film coating are thereafter removed with laser light so as to expose an underlying surface portion of the substrate and thereby form a circuit pattern on the substrate surface which is established by a portion of the metallic film remaining on the substrate surface. An additional metal layer may then be electroplated directly onto the remaining portion of the metallic film to thereby form the conductive circuit.

3 Claims, 2 Drawing Sheets

PROCESS FOR FORMING CONDUCTIVE CIRCUIT ON THE SURFACE OF MOLDED ARTICLE

FIELD OF THE INVENTION

This invention relates to a process for forming a conductive circuit on the surface of a molded article of a synthetic resin. More particularly, the invention to a process for manufacturing a molded article having an accurate conductive circuit on the surface thereof for use as a circuit component in electric and electronic machines.

BACKGROUND OF THE INVENTION

Conventional SKW and PCK processes form circuits on the surface of a molded article. According to these conventional processes, an article body is double-molded by using, for example, two kinds of materials having different plating properties. A portion of the body on which a circuit is to be formed is selectively plated utilizing the plating property differences between the circuit and non-circuit portions of the body. In such a manner, a metallic circuit is formed thereon. However, these conventional processes require two molding steps thereby making them relatively complicated and uneconomical. Moreover, it is difficult to improve the adhesion of the interface of the two kinds of resins. Thus, plating liquid may enter and remain in the article body.

Conventional circuit forming processes using photoresist have many steps including a photoresist coating step, a circuit pattern exposing step, a circuit pattern developing step, a copper etching step and a photoresist removing step. These conventional photoresist processes, therefore are quite complicated. Moreover, in order to form a three-dimensional conductive circuit on the surface of a three-dimensional molded article, a circuit which meets the desired purpose to a certain extent can be obtained by parallel-ray projection exposure. However, such a process has a problem concerning the accuracy of the circuit. In addition, there is a limit to the solution of this problem when the substrate in use has a certain three-dimensional shape.

Circuit forming processes using laser beams have been developed in recent years. For example, a process having the steps of forming a metallic film of a sufficient thickness as a conductive circuit on the surface of a molded article, and then driving off in small pieces the portion of the metallic film which is not to be used as a conductive circuit with a laser beam to obtain a conductive circuit directly has been devised. This conventional laser process does not need double molding or photoresist coating, and as a result, is relatively simple to practice. However, conventional laser processes require that a sufficiently thick conductive metallic layer (for example, more than 10 $\mu$m) be formed in order to obtain a sufficiently high conductivity. Accordingly, when an unnecessary part of such a metallic layer is removed with a laser beam, the laser output level must be increased. Therefore, even molded articles formed of a synthetic resin can be damaged by the intense laser resulting in a diminished external appearance of the product. Moreover, the synthetic resin is carbonized resulting in a deterioration of its insulation properties.

SUMMARY OF THE INVENTION

The present invention is directed to a relatively simple process for forming a circuit accurately, even on a molded article of a complicated shape, which is capable of solving the problems involved in the conventional processes discussed above. More particularly, the present invention relates to a process for forming a conductive circuit by utilizing a laser beam having a lower output level which is applied to a pre-formed metallic layer having a predetermined thickness formed on the surface of a molded synthetic resin article. An unnecessary part of the metallic layer can then be removed selectively to enable a circuit pattern to be formed without damaging the ground resin. When a subsequent metallic layer of a desired thickness is then formed on this circuit pattern by electric plating, a desired conductive circuit can be formed comparatively simply without spoiling the external appearance, shape and heat insulating characteristics of the product.

The present invention is therefore directed to a process for forming a conductive circuit on the surface of a molded article of a synthetic resin, comprising the steps of subjecting the surface of a metal-coatable molded article of a synthetic resin to metal coating by any one of the methods including chemical plating, sputtering, vacuum deposition, ion plating, and coating a conductive material to form a metallic film of 0.2–2 $\mu$m in thickness, applying a laser beam to a part of the surface of the film to remove a non-circuit portion of the film and thereby form a circuit pattern by the remaining circuit portion of the metallic film, and then electrically plating the surface of the circuit portion of the metallic film to form a conductive circuit of a desired thickness.

BRIEF DESCRIPTION OF THE ACCOMPANYING DRAWINGS

The present invention will be described in order with reference to the drawings, in which.

DETAILED DESCRIPTION OF THE INVENTION

The material for a molded article used in the present invention may consist of either thermoplastic or thermosetting resin as long as it is a synthetic resin material to which a metallic film can be deposited firmly. Since the molded article is subjected to a severe treatment, such as soldering, it is preferable that the material has a high heat resistance and a high mechanical strength. From the point of view of mass production, thermoplastic resin is preferable because it is suitable for injection molding. The examples are aromatic polyester, polyamide, polyacetal, polyphenylene sulfide, polysulfone, polyphenylene oxide, polyimide, polyether ketone, polyarylate and compositions of these substances. In view of the fact that the use of a synthetic resin having a high melting point, a high strength, a high rigidity and a moldability is required, a liquid crystalline polymer (for example, liquid crystalline polyester and polyester amide) and polyarylene sulfide are specially preferable but the resins usable in the present invention are not limited to the above. A suitable substance may be mixed with these materials as necessary so as to increase the adhesion of a metallic film.

Figure 1:
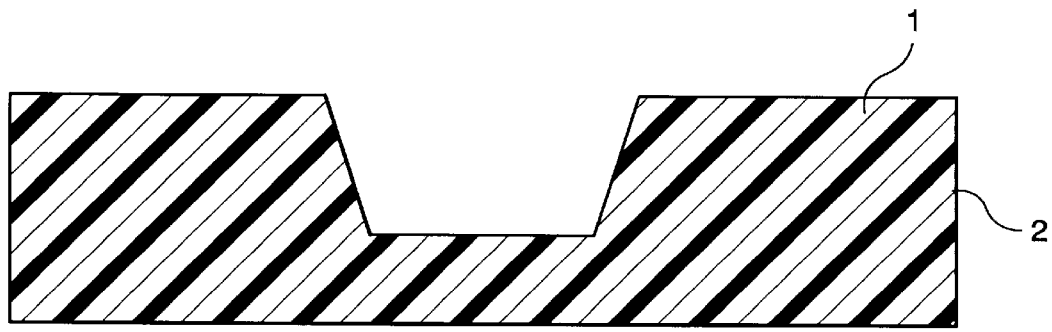
FIG. 1 is a sectional view of a substrate molded article which is to become a three-dimensional molded circuit component as an example of the present invention.

As shown in FIG. 1 a substrate molded substrate 1 is formed by injection molding. In order to improve the adhesion of a metallic film on the surface thereof, the molded substrate 1 may be further subjected to a physical surface treatment, such as chemical etching using acid, alkali and the like, or corona discharge and a plasma treatment.

Figure 2:
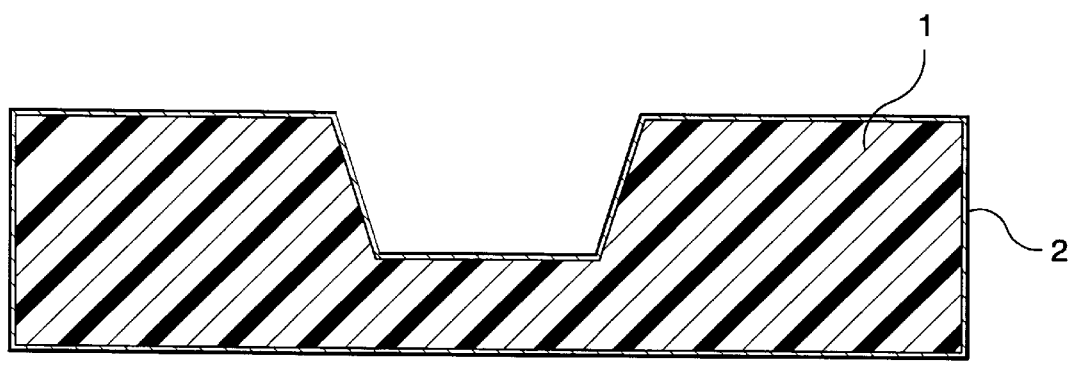
FIG. 2 is a sectional view showing the condition of the substrate molded article of FIG. 1, the surface of which was copper plated to form a copper film thereon.

The surface of this molded substrate 1 is then subjected to metal coating to form a metallic film 2 thereon as shown in FIG. 2. The thickness of metallic film 2 is especially important. When the film 2 is too thick, a high-powdered laser beam is required in a subsequent step of forming a circuit pattern which may damage the molded substrate. Conversely, when the film 2 is too thin, trouble would occur in the formation of a subsequent metallic layer of a sufficient thickness thereon as a conductive circuit by electric plating in a final step. In view of this, the thickness of a metallic film 2 on the surface of the molded substrate 1 should be 0.2–2 $\mu$m, and preferably 0.3–1 $\mu$m. When the metallic film 2 has a thickness in these ranges, a circuit pattern can be formed accurately without damage using a laser beam of comparatively low power. In addition sufficient conductivity required for the electric plating for the formation of a final circuit can be maintained. A method of forming such a metallic film 2 may consist of any of the known ones including chemical plating, sputtering, vacuum deposition, ion plating, transfer and coating of conductive material. In order to form a uniform metallic film 2, chemical plating (electroless plating), sputtering, ion plating and vacuum deposition are suitably used.

Figure 3:
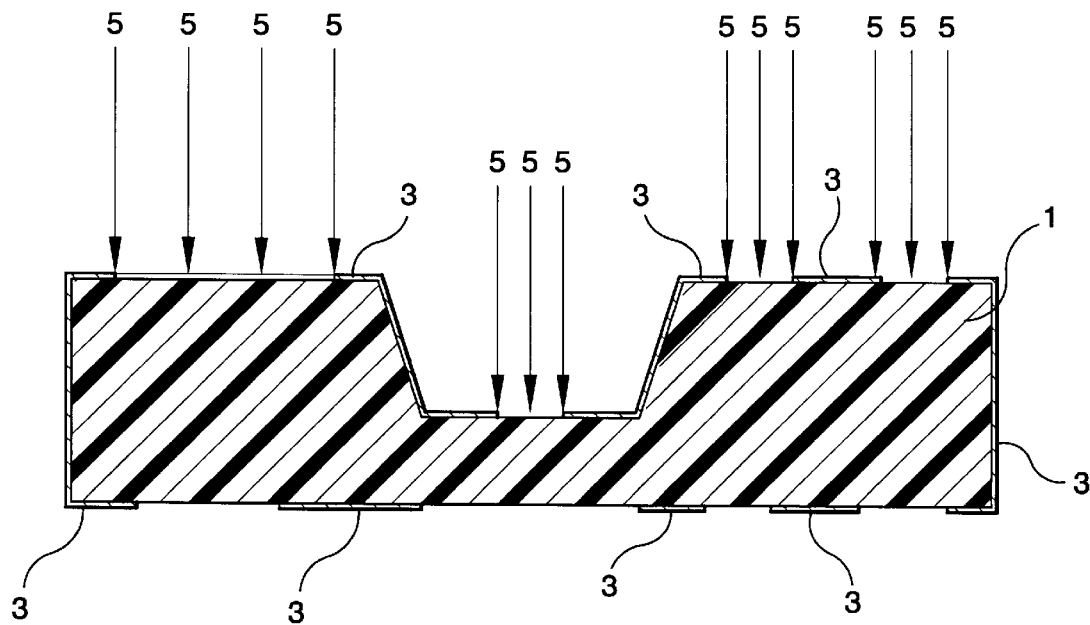
FIG. 3 is a sectional view showing the condition of the copper plated molded article of FIG. 2 in which the non-circuit portion of the copper film is removed using a YAG laser, so the circuit portion of the copper film remains as a circuit pattern on the substrate surface.

A laser beam (shown schematically by the arrows 5 in FIG. 3) of suitably regulated output is then applied to that part of the surface of the metallic film formed on the molded article (FIG. 2) which is other than a part thereof on which a circuit is to be formed (i.e. a non-circuit portion). A remaining circuit pattern portion 3 of the metallic film thereby results as shown in FIG. 3. For this purpose, a YAG laser or carbon dioxide laser may be used to emit a laser beam having a wavelength in an infrared region, and a predetermined circuit pattern is selectively irradiated with a beam from a laser marker having a computer-controlled XY scanning unit. When it is necessary to form a circuit on a complicated three-dimensional molded article, a predetermined region thereof can be irradiated with a laser beam three-dimensionally with a high accuracy by a computer controlling means with the laser beam guided in a three-dimensional direction by an optical fiber or a prism. This process is advantageous in that the preparation and correction of a pattern can be carried out simply by merely changing a program of drawing an image on a region to which a laser beam is to be applied.

Figure 4:
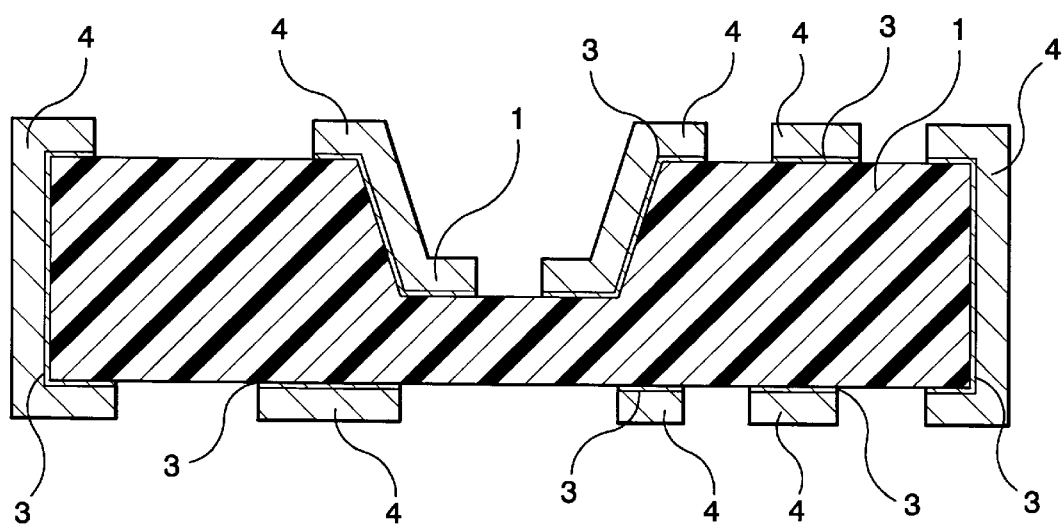
FIG. 4 is a sectional view showing the condition of the circuit pattern-carrying molded articles of FIG. 3 which is subjected to electric copper plating to form a circuit having a metallic layer of desired thickness.

A molded article on which a circuit pattern 3 of a metallic film is formed may be used as it is as a circuit component if it can meet its end-use purposes. However, in general, a film circuit thinner than 2 $\mu$m mentioned above involves inconveniences in many cases from the point of view of its conductivity or the possibility of damage ascribed to friction, and it is required to have a thickness of at least 10 $\mu$m. Therefore, according to the present invention, the surface of the circuit pattern portion 3 is further subjected to electric plating to add a metallic layer 4 of a desired thickness (for example, 10–100 $\mu$m) thereto, whereby a final circuit is formed as shown in FIG. 4. Since an already-formed circuit pattern portion 3 has such a degree of conductivity that permits the same pattern to be electrically plated, conventionally used electric plating techniques can be used to form the metallic layer 4.

According to the present invention, complicated complex molding which is carried out in the SKW process and PCK process is not required, nor does it require the complicated steps carried out in a darkroom, such as the exposure and development of a circuit pattern in a process using photoresist. Moreover, it is possible to avoid damage to a molded article by a laser beam, which may degrade the external appearance, shape and insulation. Therefore, a molded article having a precise conductive circuit of a desired thickness can be obtained by simple steps, so that this process is advantageous in the economical respect as well.

EXAMPLES

An embodiment of the present invention will now be described with reference to the following non-limiting Examples.

Example 1

A three-dimensional molded article 1 was prepared (FIG. 1) by injection molding a metal-adhesive (chemically platable) resin composition containing as a main component liquid crystalline polyester ("Vectra" manufactured by the Polyplastics Co., Ltd.). This molded article was then degreased, and the substantially whole surface of the resultant product was etched with aqueous KOH solution, the etched product being neutralized with an aqueous HCl solution and then washed. A catalyst ("Catalyst A-30" manufactured by the Okuno Seiyaku Kogyo Co., Ltd.) was applied to the washed product to activate the surface thereof, and the resultant product was immersed in a chemical copper plating liquid (OPC-750 manufactured by the Okuno Seiyaku Kogyo Co., Ltd.) to form a chemical copper layer 2 of 0.6 $\mu$m in thickness on the surface of the molded article. The resultant molded article was washed thoroughly and thereafter dried (FIG. 2).

A laser beam from a 0.5-watt YAG laser 5 was applied to the molded article (FIG. 2) the surface of which had been chemical copper plated to remove the part of the copper film which was other than a part thereof on which a circuit was to be formed, whereby a circuit pattern 3 was formed (FIG. 3).

The molded article (FIG. 3) on which this circuit pattern had been formed was subjected to electric copper plating to obtain a precise three-dimensional conductive circuit 4 of a copper film of 30 $\mu$m in thickness (FIG. 4). It was ascertained that the exposed resin surface portion of this molded article which was other than the circuit portion thereof was not substantially damaged.

Comparative Example 1

A molded article having a 5 $\mu$m copper film was prepared in the same manner as in Example 1 except that the thickness of a chemical capper layer on the surface of the molded article was set to 5 $\mu$m. A circuit pattern was tried to be formed on this molded article by using a 0.6-watt laser beam as was used in Example 1, but the output level of the laser beam was too low for the thickness of the copper film, so that it was difficult to form a circuit pattern on the film. When the output level of the laser beam was increased gradually, the forming of a circuit pattern became possible but a precise circuit pattern could not be obtained. Moreover, the base surface of the resin was damaged.

Comparative Example 2

The surface of a molded article was subjected to chemical copper plating (to obtain a 0.6 μm film) by the same process as was used in Example 1, and then electric copper plating to coat the whole surface of the molded article with a 30 μm thick copper film. This electrically plated molded article was irradiated with a 5 to 15- watt laser beam from a YAG laser, but the copper film could not be completely removed, so that the formation of a circuit pattern could not be carried out. When the output level of the laser beam was increased until the copper plating could be removed. As a result, it was ascertained that the exposed base surface of the resin was damaged (carbonized) so greatly that the resultant product could not be used as a circuit component.

I claim:

1. A process for forming a conductive circuit comprising the steps of:
   (i) metallizing a surface of a substrate molded from a metallizable polymer material which is at least one polymer selected from the group consisting of liquid crystalline polymers and polyarylene sulfide polymers to form a thin metal film on the substrate surface having a thickness of 0.6 to 2 μm;
   (ii) forming a circuit pattern comprising the thin metal film by removing the metal film present on a non-circuit pattern portion of the substrate surface by irradiating the non-circuit pattern portion of the substrate surface with a laser beam with a computer-controlled XY scanning unit so that a circuit portion of the metal film remains present on the substrate surface corresponding to the circuit pattern; and
   (iii) subjecting the resulting circuit portion of the thin metal film which remains on the substrate surface corresponding to the circuit pattern to electroplating to form an additional metal layer thereon to thereby form a conductive circuit having a desired thickness.

2. The process of claim 1, wherein the polymer is a liquid crystalline polyester.

3. The process of claim 2, wherein the liquid crystalline polyester is a liquid crystalline polyester amide.

* * * * *